(12) United States Patent
Oh

(10) Patent No.: US 6,380,102 B1
(45) Date of Patent: Apr. 30, 2002

(54) METHOD FOR FABRICATING GATE OXIDE FILM OF SEMICONDUCTOR DEVICE

(75) Inventor: Jong-Hyuk Oh, Choongcheongnam-Do (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 0 days.

(21) Appl. No.: 09/770,672

(22) Filed: Jan. 29, 2001

(30) Foreign Application Priority Data

Aug. 16, 2000 (KR) ........................................ 2000-47183

(51) Int. Cl.$^7$ ............................................... H01L 21/31
(52) U.S. Cl. ........................ 438/771; 438/770; 438/981
(58) Field of Search ................................ 438/770, 771, 438/981

(56) References Cited

U.S. PATENT DOCUMENTS 6,110,842 A * 8/2000 Okuno et al. ............... 438/776
6,147,008 A * 11/2000 Chwa et al. ................ 438/672
6,258,673 B1 * 7/2001 Houlihan et al. ........... 438/275
6,261,972 B1 * 7/2001 Tews et al. ................ 438/766

* cited by examiner

Primary Examiner—Alexander G. Ghyka
(74) Attorney, Agent, or Firm—Morgan, Lewis & Bockius LLP

(57) ABSTRACT

The present invention relates to a method for fabricating a semiconductor device, and more particularly, to a method for fabricating a gate oxide film of a semiconductor device by which semiconductor devices having different electrical characteristics can be implemented in the same chip. The present invention provides a method for fabricating a gate oxide film of a semiconductor device which includes the steps of: forming a screen oxide film on the top surface of a semiconductor substrate; forming an ion implantation mask on parts of the top surface of the screen oxide film; implanting nitrogen ions into the semiconductor substrate using the ion implantation mask; removing the ion implantation mask and the screen oxide film; forming an oxide film on the top surface of the semiconductor substrate; and annealing the semiconductor substrate in a $N_2O$ or $O_3$ atmosphere.

15 Claims, 6 Drawing Sheets

METHOD FOR FABRICATING GATE OXIDE FILM OF SEMICONDUCTOR DEVICE

This application claims the benefit of Korean Application No. 47183/1999, filed in the Republic of Korea on Aug. 16, 2000, which is hereby incorporated by reference.

BACKGROUND OF THE INVENTION

1. Field of the Invention

The present invention relates to a method for fabricating a semiconductor device, and more particularly, to a method for fabricating a gate oxide film of a semiconductor device by which semiconductor devices having different electrical characteristics can be implemented in the same chip.

2. Description of the Background Art

Recently, as the degree of integration of a semiconductor, in particular, a DRAM (dynamic random access memory) increases, it is often the case that a transistor of a memory cell unit and a transistor of a peripheral circuit have a different operating voltage with each other. In other words, the transistor of the memory cell unit fabricated with a fine line width operates at a voltage less than 1.8V, and the transistor of the peripheral circuit operates at a voltage of 3.3V or 5V for matching with exterior system equipment.

Accordingly, as devices having different operating voltages are formed in the same chip, there occurs a problem that a gate oxide film of the transistors formed in the same semiconductor chip must have different thicknesses.

Methods conventionally known as a method for forming a gate electrode having different thicknesses in the same chip will now be described.

First, FIGS. 1A through 1D illustrate a method for fabricating a gate oxide film by a dual step oxidation process.

As illustrated in FIG. 1A, a semiconductor substrate 10 is prepared.

Next, as illustrated in FIG. 1B, a first gate oxide film 11 is formed on the top surface of the semiconductor substrate 10.

Next, as illustrated in FIG. 1C, the first gate oxide film 11 of a portion on which a relatively thin gate oxide film is to be selectively etched and removed to thereby expose parts of the top surface of the semiconductor substrate 10.

Next, as illustrated in FIG. 1D, a second gate oxide film 12 is formed on the top surface of the first gate oxide film 11 and the top surface of the semiconductor device 10.

Besides the above-said method using the dual step oxidation process, there is a method for fabricating a gate oxide film using an ion implantation process. This method will now be described with reference to FIGS. 2A through 2D and FIGS. 3A through 3D.

First, FIGS. 2A through 2D illustrates a method for fabricating a gate oxide film using a nitrogen ion implantation process.

As illustrated in FIG. 2A, a semiconductor substrate 20 is prepared.

Next, as illustrated in FIG. 2B, a screen oxide film 21 is formed on the top surface of the semiconductor substrate 20. Then, an ion implantation mask 22 is formed on the screen oxide film 21 of a portion on which a relatively thick oxide film is to be formed. Then, nitrogen ($N_2$) ions are implanted into the semiconductor substrate 20 of a portion being not covered with the ion implantation mask 22.

Next, as illustrated in FIG. 2C, the screen oxide film 21 and the ion implantation mask are removed.

Next, when a gate oxide film 23 is formed on the top surface of the semiconductor substrate 20, as illustrated in FIG. 2D, a thin oxide film 23a is formed on a portion into which nitrogen ions are implanted, because oxidation is restrained, and a relatively thick oxide film 23b is formed on a portion into which nitrogen ions are not implanted.

In addition, a method for fabricating a gate oxide film using a fluoride ion implantation process will now be described with reference to FIGS. 3A through 3D.

First, as illustrated in FIG. 3A, a semiconductor substrate 30 is prepared.

Next, as illustrated in FIG. 3B, a screen oxide film 31 is formed on the top surface of the semiconductor substrate 30. Next, an ion implantation mask 32 is formed on the top surface of the screen oxide film 31 of a portion on which a relatively thin gate oxide film is to be formed. Then, fluoride ions are implanted into the semiconductor substrate 30 using the ion implantation mask 32.

Next, as illustrated in FIG. 3C, the ion implantation mask 32 and the screen oxide film 31 are removed.

Next as illustrated in FIG. 3D, a gate oxide film 33 having different thicknesses is formed on the top surface of the semiconductor substrate 30 by oxidation of the semiconductor substrate 30. That is, a thick gate oxide film is formed on the top surface of the semiconductor of a portion into which fluoride ions are implanted, and a thin gate oxide film is formed on a portion into which fluoride ions are not implanted.

However, the above-described conventional methods for fabricating a gate oxide film has the following problems. First, the method for fabricating a gate oxide film by the dual step oxidation process has a complicated procedure, and a peripheral portion of a fabricated, thick gate oxide film becomes thinner and a breakdown is easily occurred on a thinned portion.

Second, in case of the fluoride ion implantation process, since a large amount of fluoride ions must be implanted in order to make the thickness of a gate oxide film different according to its portion, the semiconductor substrate is largely damaged to thus increase the amount of leakage current.

Third, the nitrogen implantation process is disadvantageous in that, in case of forming a gate oxide film on the top surface of the semiconductor substrate into which nitrogen ions are implanted, the gate oxide film is degraded, although it is advantageous in that a smaller amount of ions can be implanted as to compared to the fluoride ion implantation process, which rather decreases the amount of leakage current.

SUMMARY OF THE INVENTION

Accordingly, the present invention provides a method for fabricating a gate oxide film of a semiconductor device having a small leakage current amount and a high reliability by reducing the concentration of nitrogen in the gate oxide film when a gate oxide film having different thicknesses according to its portion is fabricated on the top surface of a semiconductor substrate using a nitrogen ion implantation process.

A method for fabricating a gate oxide film of a semiconductor device according to the present invention includes the steps of: forming a screen oxide film on the top surface of a semiconductor substrate; forming an ion implantation mask on parts of the top surface of the screen oxide film; implanting nitrogen ions into the semiconductor substrate using the ion implantation mask; removing the ion implantation mask and the screen oxide film; forming an oxide film on the top surface of the semiconductor substrate; and annealing the semiconductor substrate.

There is provided a method for fabricating a gate oxide film of a semiconductor device according to the present invention which further includes a pre-annealing step after the ion implantation step.

A method for fabricating a gate oxide film of a semiconductor device according to the present invention includes the pre-annealing step by a process of annealing at 500–900° C. by a furnace annealing method.

In a further aspect of the invention, there is provided a method for fabricating a gate oxide film of a semiconductor device wherein the pre-annealing step is a process of annealing at 850–1200° C. by a rapid thermal annealing method.

In another aspect of the invention, there is provided a method for fabricating a gate oxide film of a semiconductor device wherein the oxide film formation step being a method for thermal oxidation at a furnace of 700–950° C.

A method for fabricating a gate oxide film of a semiconductor device according to the present invention includes the oxide film formation step being a method for thermal oxidation at 850–1200° C. at the rapid thermal annealing method.

A method for fabricating a gate oxide film of a semiconductor device according to the present invention includes the annealing step being performed by means of the rapid thermal annealing method in a $N_2O$ atmosphere at a temperature of 900–1200° C. for about less than five minutes.

The annealing step can also be performed by means of the thermal annealing method in an $O_3$ atmosphere at a temperature of 400–1200° C. for about five minutes.

The annealing step can also be performed by means of the furnace annealing method in a $N_2O$ atmosphere at a temperature of 850–1200° C. for about one hour.

In another aspect of the invention, there is provided a method for fabricating a gate oxide film of a semiconductor device according to the present invention wherein the annealing step is performed by means of the rapid thermal annealing method in a $N_2O$ atmosphere at a temperature of 900–1200° C. for about less than five minutes.

Additional advantages, aspects and features of the invention will become more apparent from the description which follows.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A first embodiment of the present invention will now be described with reference to the accompanying drawings.

Figure 1A:
FIGS. 1A through 1D are a process chart illustrating one example of a method for fabricating a gate oxide film according to the conventional art.
Figure 1B:
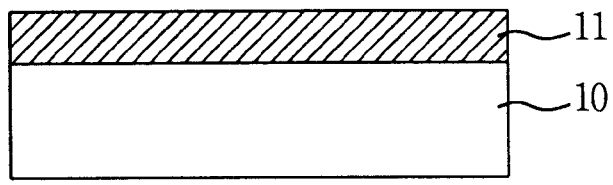
Figure 1C:
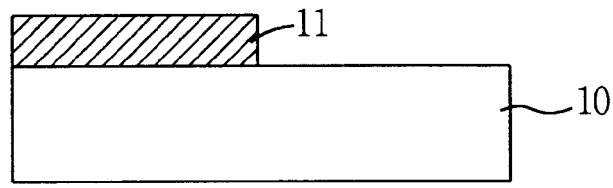
Figure 1D:
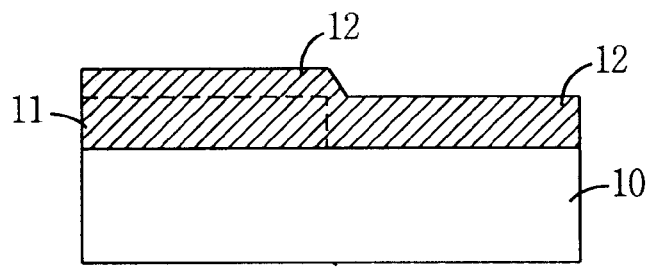
Figure 2A:
FIGS. 2A through 2D are a process chart illustrating another example of a method for fabricating a gate oxide film according to the conventional art.
Figure 2B:
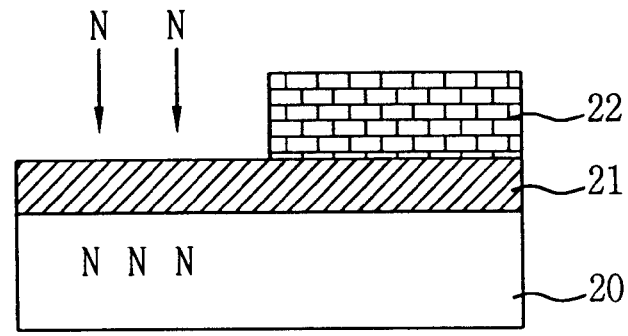
Figure 2C:
Figure 2D:
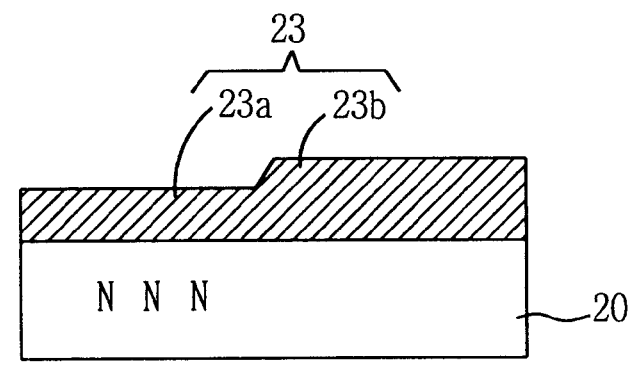
Figure 3A:
FIGS. 3A through 3D are a process chart illustrating still another example of a method for fabricating a gate oxide film according to the conventional art.
Figure 3B:
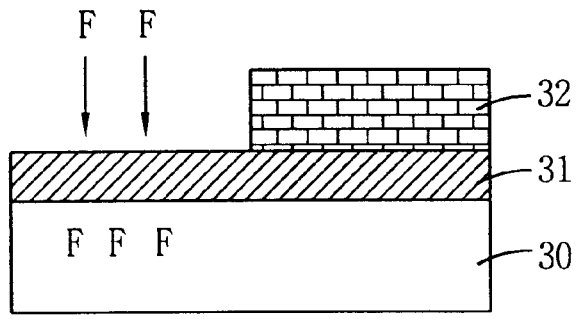
Figure 3C:
Figure 3D:
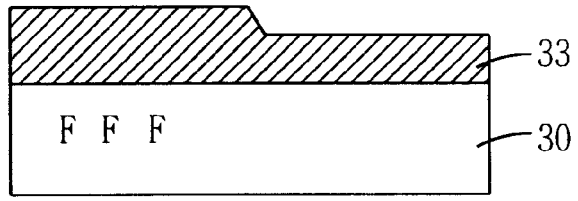
Figure 4A:
FIGS. 4A through 4D are a process chart illustrating a method for fabricating a gate oxide film according to the present invention.
Figure 4B:
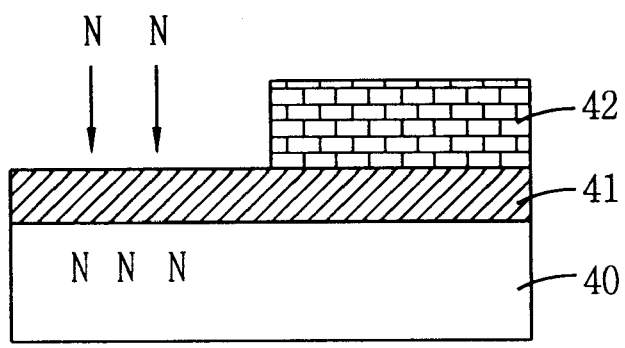

First, as illustrated in FIGS. 4A and 4B, a screen oxide film 41 is formed on the top surface of a semiconductor device at a thickness of less than 200 Å.

Next, as illustrated in FIG. 4B, an ion implantation mask 42 is formed on the top surface of the screen oxide film 41. The ion implantation mask 42 is formed only on the top surface of a portion on which a relatively thick gate oxide film is to be formed. Then, nitrogen ions are implanted into the semiconductor substrate 40. At this time, the ion implantation process is performed with the implantation amount of nitrogen ions ranging from $5 \times 10^{13}$ cm$^2$ to $5 \times 10^{11}$ cm$^2$ and the ion implantation energy of 5–50 KeV.

Next, in order to prevent the damage to the semiconductor substrate occurred due to the ion implantation process and move the distribution of nitrogen (N) atoms in the vicinity of the screen oxide film 41, a pre-annealing process is performed. At this time, in case of furnace annealing, the pre-annealing process is performed at a furnace temperature of 500–900° C. for less than six hours. Meanwhile, in case of rapid thermal annealing (RTA), the pre-annealing process is performed at 850–1200° C. for less than five minutes.

Figure 4C:
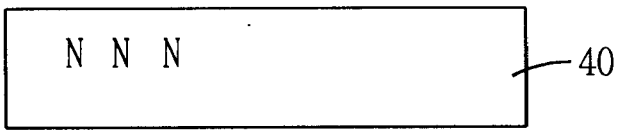

Next, as illustrated in FIG. 4C, the screen oxide film 41 and the ion implantation mask 42 are removed.

Figure 4D:
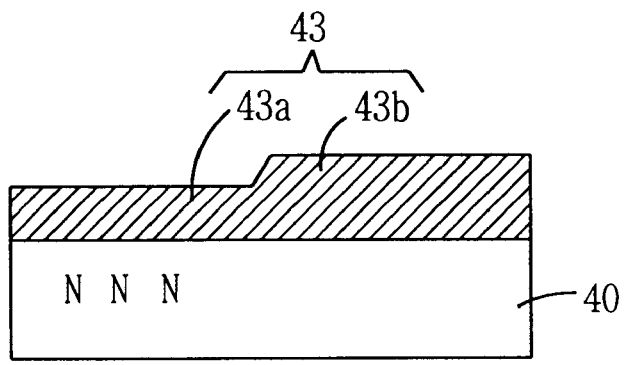

Next, as illustrated in FIG. 4D, a gate oxide film 43 is formed on the top surface of the semiconductor substrate 40. At this time, a relatively thin gate oxide film 43a is formed on the top surface of the semiconductor substrate of a portion into which nitrogen ions are implanted, and a relatively thick gate oxide film 43b is formed on the top surface of the semiconductor substrate of a portion into which nitrogen ions are not implanted. In addition, the oxide film formation process is a process of wet oxidation at a furnace temperature of 700–950° C. by the rapid thermal annealing method, or a process of dry oxidation at a furnace temperature of 850–1200° C. by the same method.

Next, as illustrated in FIG. 4D, the semiconductor substrate 40 on which the gate oxide film 43 is fabricated is annealed. The conditions of the annealing process are as follows. In case of the rapid thermal annealing process, it is performed in a $N_2O$ gas atmosphere at 850–1200° C. for about less than five minutes. In case of the furnace annealing process, it is performed in a $N_2O$ gas atmosphere at 800–1200° C. for about less than one hour. During this annealing process, nitrogen atoms (N) in the semiconductor substrate are moved to the interface between the oxide film and the semiconductor substrate to thus increase the nitrogen concentration of the interface portion, and nitrogen atoms (N) in the oxide film go outside to thus decrease the nitrogen concentration of the gate oxide film.

Figure 5:
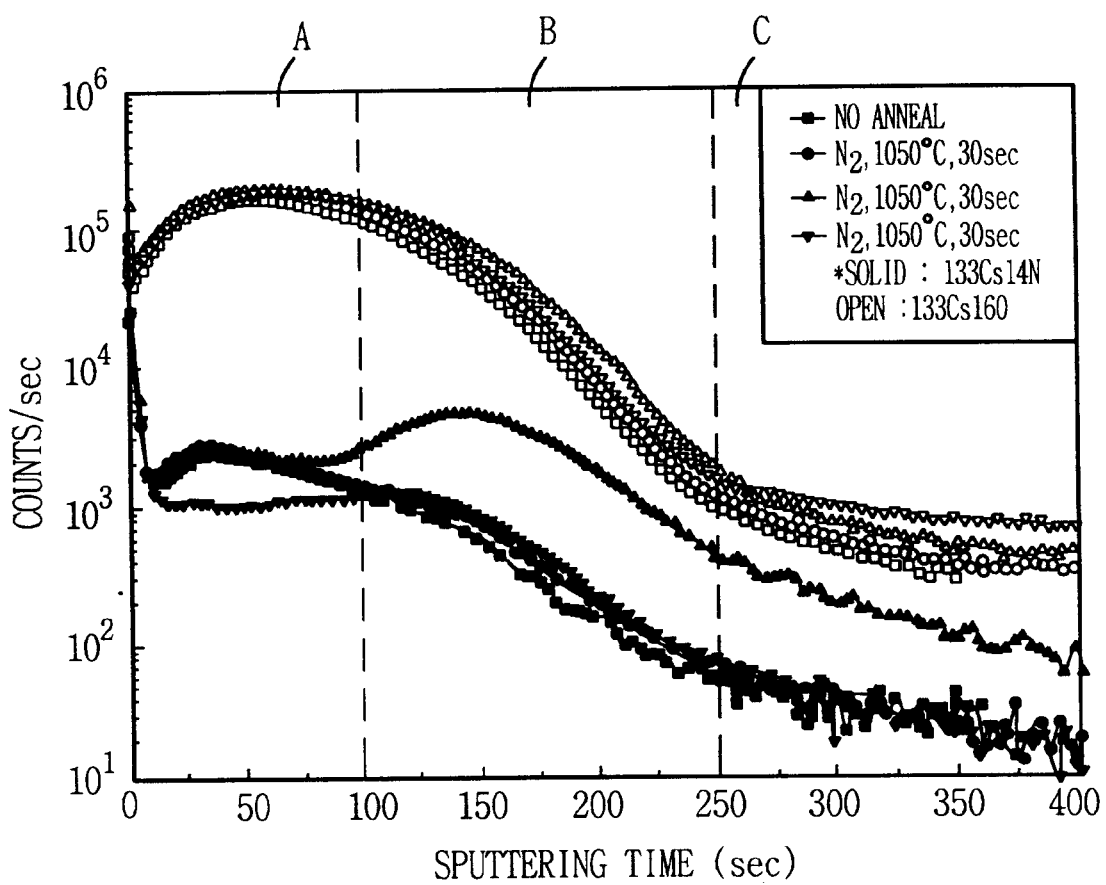
FIG. 5 is a graph illustrating the results of the SIMS analysis after annealing.

FIG. 5 is a graph illustrating the changes in the number of nitrogen atoms in the gate oxide film in both cases of including the annealing process and not including the annealing process after the formation of the gate oxide film. That is, FIG. 5 shows the results of the SIMS (secondary ion mass spectroscopy) analysis after the annealing process. In FIG. 5, white plots ("□", "○", "△", "▽") show the number of oxygen atoms, while black plots ("■", "●", "▲", "▼") show the number of nitrogen atoms. In particular, plots "□" and "■" show the number of oxygen atoms and the number of nitrogen atoms, respectively, when the annealing is not performed. The plots "○" and "●" show the number of oxygen atoms and the number of nitrogen atoms, respectively, when the annealing is performed in a $N_2$ atmosphere at 1050° C. for 30 seconds. The plots "△" and "▲" show the number of oxygen atoms and the number of nitrogen atoms, respectively, when the annealing is performed in a NO atmosphere. The plots "▽" and "▼" show the number of oxygen atoms and the number of nitrogen atoms, respectively, when the annealing is performed in a $N_2O$ atmosphere.

FIG. 5 illustrates the changes in the number of nitrogen atoms according to a sputtering time. In addition, the graph of FIG. 5 corresponds to the profile of nitrogen atoms in the oxide film and the semiconductor substrate. In FIG. 5, it is assumed that a region ("A" zone) in which the number of oxygen atoms is large shows the depth profile of the distribution of concentration of oxygen atoms in the oxide film region, a region ("C" zone) in which the number of oxygen atoms is small shows the depth profile of the distribution of concentration of oxygen atoms in the silicon substrate region, and the middle region ("B" zone) shows the profile of oxygen atoms in the interface portion between the oxide film and the semiconductor substrate.

As illustrated in FIG. 5, as the result of performing annealing in a $N_2O$ atmosphere at 1050° C. for 30 seconds by the rapid thermal annealing method, it is shown that the number of nitrogen atoms in the oxide film ("A" zone) is decreased as compared to the case of not performing annealing. This is because the nitrogen atoms are discharged to the outside during the annealing process. In addition, it is shown that the number of nitrogen atoms is slightly increased in the interface portion ("B" zone) between the oxide film and the silicon substrate. This is because nitrogen ions in the semiconductor substrate move toward the interface portion during the annealing process.

Meanwhile, in case of performing annealing in a NO atmosphere, there is almost no change in the profile of nitrogen atoms in the oxide film as compared to prior to the annealing, and the number of nitrogen atoms in the interface between the semiconductor substrate and the oxide film is increased.

On the contrary, in case of performing annealing in a $N_2$ atmosphere, there is no change in the profile of nitrogen atoms in the oxide film.

Thus, it is most appropriate that the annealing is performed in a $N_2O$ atmosphere so as to improve the characteristics of the semiconductor device.

Figure 6:
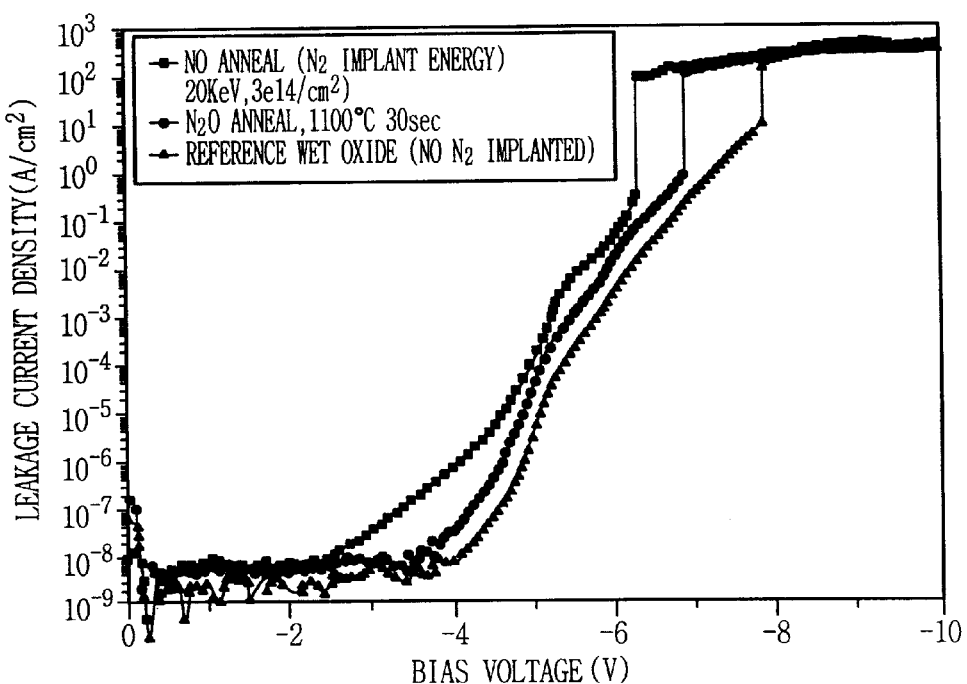
FIG. 6 is a graph illustrating the changes in leakage current after annealing of a gate oxide film.

Meanwhile, FIG. 6 is a graph illustrating the increase of the amount of leakage current after forming a gate oxide film and performing annealing. As illustrated therein, in case of performing the annealing in a $N_2O$ atmosphere, it can be known that the amount of leakage current is decreased as compared to the case of not performing the annealing.

Figure 7:
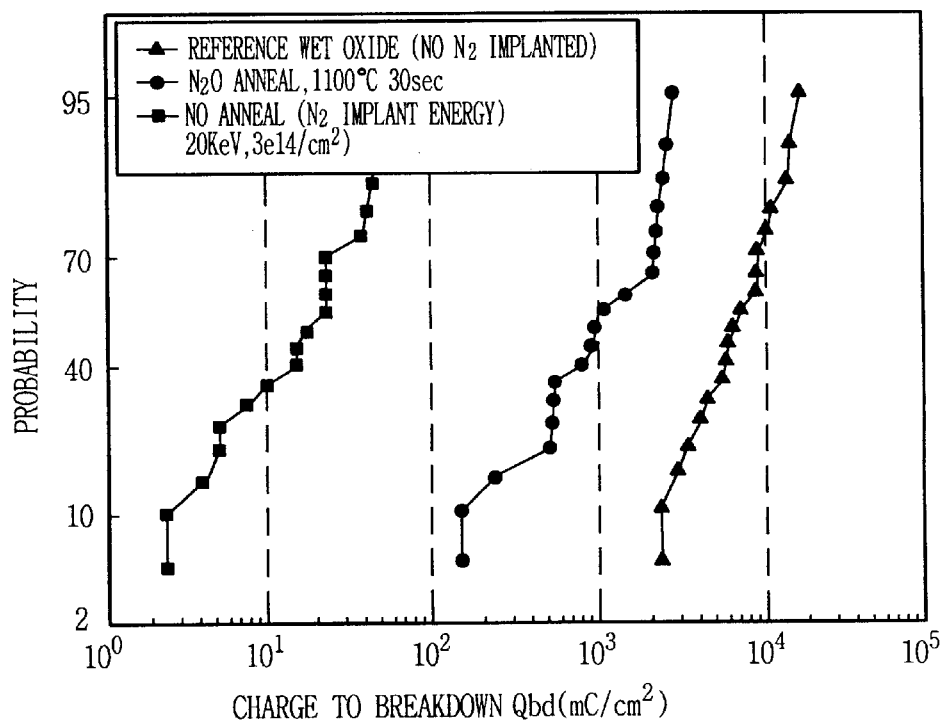
FIG. 7 is a graph illustrating the characteristics of an oxide film, e.g., a graph illustrating the amount of electric charge accumulated in the oxide film to the breakdown of the oxide film.

In addition, FIG. 7 is a graph illustrating the characteristics of the oxide film, which shows the amount of electric charge (Qbd) accumulated in the oxide film to the breakdown of the oxide film. In FIG. 7, the plot "■" shows the case of not performing the annealing, the plot "●" shows the case of performing the annealing, and the plot "▲" shows the case of not performing a nitrogen ion implantation.

As illustrated therein, it can be known that the Qbd after the annealing is larger than the Qbd prior to the annealing, after the nitrogen ion implantation.

Therefore, when the annealing is performed in a $N_2O$ or $O_3$ atmosphere after the nitrogen ion implantation, the degree of degradation of the oxide film becomes lower, and the reliability of the oxide film become higher, as compared to the case of not performing the annealing.

According to the present invention, the concentration of nitrogen in the gate oxide film is decreased, and the concentration of nitrogen in the interface between the gate oxide film and the semiconductor substrate is increased, by additionally including an annealing process after the formation of the gate oxide film, in fabricating multiple gate oxide films using a nitrogen ion implantation. As the result, there is an effect of decreasing the degradation of the gate oxide film and the amount of leakage current for thereby increasing the reliability of the gate oxide film. In addition, since the concentration of nitrogen in the interface between the gate oxide film and the semiconductor substrate is increased, in case of a P-MOS transistor, boron in a gate electrode is prevented from penetrating into the semiconductor substrate, thus making the change in threshold voltage of the transistor and improving the characteristics of the semiconductor device.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for fabricating a gate oxide film of a semiconductor device, comprising the steps of:

forming a screen oxide film on a top surface of a semiconductor substrate;

forming an ion implantation mask on parts of a top surface of the screen oxide film;

implanting nitrogen ions into the semiconductor substrate using the ion implantation mask;

removing the ion implantation mask and the screen oxide film;

forming an oxide film on the top surface of the semiconductor substrate; and annealing the semiconductor substrate.

2. The method according to claim 1, wherein the method further comprises a pre-annealing step after the ion implantation step.

3. The method according to claim 2, wherein the pre-annealing step is a process of annealing at 500–900° C. by a furnace annealing method.

4. The method according to claim 2, wherein the pre-annealing step is a process of annealing at 850–1200° C. by a rapid thermal annealing method.

5. The method according to claim 1, wherein the oxide film formation step is a method for thermal oxidation at a furnace of 700–950° C.

6. The method according to claim 1, wherein the oxide film formation step is a method for thermal oxidation at 850–1200° C. at a rapid thermal annealing method.

7. The method according to claim 1, wherein the annealing step is performed by means of a rapid thermal annealing method in a $N_2O$ atmosphere at a temperature of 900–1200° C. for about less than five minutes.

8. The method according to claim 1, wherein the annealing step is performed by means of a thermal annealing method in an $O_3$ atmosphere at a temperature of 400–1200° C. for about five minutes.

9. The method according to claim 1, wherein the annealing step is performed by means of a furnace annealing method in a $N_2O$ atmosphere at a temperature of 850–1200° C. for about one hour.

10. The method according to claim 3, wherein the annealing step is performed by means of a rapid thermal annealing method in a $N_2O$ atmosphere at a temperature of 900–1200° C. for about less than five minutes.

11. The method according to claim 3, wherein the annealing step is performed by means of a rapid thermal annealing method in an $O_3$ atmosphere at a temperature of 400–1200° C. for about five minutes.

12. The method according to claim 4, wherein the annealing step is performed by means of a furnace annealing method in a $N_2O$ atmosphere at a temperature of 850–1200° C. for about one hour.

13. The method according to claim 4, wherein the annealing step is performed by means of the rapid thermal annealing method in a $N_2O$ atmosphere at a temperature of 900–1200° C. for about less than five minutes.

14. The method according to claim 4, wherein the annealing step is performed by means of a rapid thermal annealing method in an $O_3$ atmosphere at a temperature of 400–1200° C. for about five minutes.

15. The method according to claim 4, wherein the annealing step is performed by means of a furnace annealing method in a $N_2O$ atmosphere at a temperature of 850–1200° C. for about one hour.

* * * * *